US012643412B2

(12) United States Patent
Tessier, Jr. et al.

(10) Patent No.: US 12,643,412 B2
(45) Date of Patent: *Jun. 2, 2026

(54) DEPLOYABLE RESISTOR TO DISSIPATE POWER DURING REGENERATIVE BRAKING FOR ELECTRIFIED VEHICLE

(71) Applicant: FCA US LLC, Auburn Hills, MI (US)

(72) Inventors: Raymond Tessier, Jr., Onsted, MI (US); Michael J Bachmann, Waterford, MI (US)

(73) Assignee: FCA US LLC, Auburn Hills, MI (US)

( * ) Notice: Subject to any disclaimer, the term of this patent is extended or adjusted under 35 U.S.C. 154(b) by 187 days.

This patent is subject to a terminal disclaimer.

(21) Appl. No.: 18/451,875

(22) Filed: Aug. 18, 2023

(65) Prior Publication Data

US 2025/0058642 A1 Feb. 20, 2025

(51) Int. Cl.
| | |
|---|---|
| *H02P 6/15* | (2016.01) |
| *B60L 1/00* | (2006.01) |
| *B60L 7/22* | (2006.01) |
| *B60L 7/26* | (2006.01) |
| *H02P 6/28* | (2016.01) |
| *H05K 7/20* | (2006.01) |
| *B60L 50/60* | (2019.01) |

(52) U.S. Cl.
CPC .................. B60L 7/22 (2013.01); B60L 1/00 (2013.01); B60L 7/26 (2013.01); H05K 7/20209 (2013.01); *B60L 50/60* (2019.02); *B60L 2240/36* (2013.01)

(58) Field of Classification Search
CPC .. H02P 3/12; H02P 21/22; H02P 21/28; H02P 3/14; H02P 9/305; H02P 9/48
See application file for complete search history.

(56) References Cited

U.S. PATENT DOCUMENTS

| | | | |
|---|---|---|---|
| 2021/0347265 A1* | 11/2021 | Park | B60T 1/10 |
| 2023/0298785 A1* | 9/2023 | Rahm | H01C 1/082 338/55 |
| 2024/0217516 A1* | 7/2024 | Sommansson | B60L 15/2009 |

* cited by examiner

*Primary Examiner* — Kawing Chan
*Assistant Examiner* — Charles S Laughlin
(74) *Attorney, Agent, or Firm* — Jeremy J. Klobucar

(57) ABSTRACT

A regenerative braking system for an electrified vehicle includes a battery system, an electric motor and a regenerative system resistor. The battery system selectively stores and delivers power. The electric motor is powered by the battery system and transfers drive torque to a driveline for propulsion of the vehicle and that selectively directs regenerative power in a first mode to the battery system during regenerative braking. The regenerative system resistor is selectively moveable between a first position during the regenerative braking in the first mode and a second position where regenerative power is directed to the regenerative system resistor and dissipated as heat in a second mode. At least one fan is disposed on the regenerative system resistor and selectively operates to direct air onto the regenerative system resistor based on operating conditions.

19 Claims, 6 Drawing Sheets

Brake Resistor Deployed

*200*

DEPLOYABLE RESISTOR TO DISSIPATE POWER DURING REGENERATIVE BRAKING FOR ELECTRIFIED VEHICLE

FIELD

The present application generally relates to electrified vehicles and, more particularly, to a deployable resistor that dissipates power during regenerative braking when a battery state of charge is high.

BACKGROUND

An electrified vehicle (hybrid electric, plug-in hybrid electric, range-extended electric, battery electric, etc.) includes at least one battery system and at least one electric motor. Typically, the electrified vehicle would include a high voltage battery system and a low voltage (e.g., 12 volt) battery system. In such a configuration, the high voltage battery system is utilized to power at least one electric motor configured on the vehicle and to recharge the low voltage battery system via a direct current to direct current (DC-DC) convertor.

The high voltage battery system generally includes a battery pack assembly including one or more battery modules that can be charged such as by plugging into a power supply or by receiving a charging input from a vehicle component. In examples, some electrified vehicles are configured with regenerative braking systems that can convert vehicle braking energy into a charging input to the battery system during vehicle braking. In some conditions where the vehicle battery system is already sufficiently charged, it is undesirable to use regenerative braking as a charging input. However, disabling regenerative braking entirely can cause an inconsistent driving experience as the customer can perceive unfamiliar feedback from the vehicle driveline as a result of the disabled regenerative braking functionality. Accordingly, while such battery systems do work well in combination with regenerative braking systems for their intended purpose, there exists an opportunity for improvement in the relevant art.

SUMMARY

According to one example aspect of the invention, a regenerative braking system for an electrified vehicle includes a battery system, an electric motor and a regenerative system resistor. The battery system selectively stores and delivers power. The electric motor is powered by the battery system and transfers drive torque to a driveline for propulsion of the vehicle and selectively directs regenerative power in a first mode to the battery system during regenerative braking. The regenerative system resistor is selectively moveable between a first position during the regenerative braking in the first mode and a second position where regenerative power is directed to the regenerative system resistor and dissipated as heat in a second mode. At least one fan is disposed on the regenerative system resistor and selectively operates to direct air onto the regenerative system resistor based on operating conditions. A controller receives a signal from a sensor associated with the regenerative system resistor and operates the fan based on the signal.

In some implementations, in the first position, the regenerative system resistor is retracted toward the electrified vehicle out of alignment with a direct air path during operation of the electrified vehicle. In the second position, the regenerative system resistor is moved to a deployed position from the electrified vehicle in substantial alignment with a direct air path during operation of the electrified vehicle.

In some implementations, the regenerative braking system can further include an actuator that selectively moves the regenerative system resistor between the retracted and deployed positions.

According to another example aspect of the invention, the sensor is a temperature sensor that senses a temperature of the regenerative braking system. In another example, the sensor is an air flow sensor that senses an airflow at the regenerative system resistor. The controller operates the fan at variable speed based on the signal received from the sensor.

In some implementations, a controller determines whether regenerative braking is required and send a signal to the actuator to deploy the regenerative system resistor based on the determination. The controller is further configured to determine whether the battery system can accept full power input from the electric motor and deploy the regenerative system resistor based on the determination. The controller is further configured to determine whether accessory loads can dissipate full regenerative power and deploy the regenerative system resistor based on the determination.

In some implementations, in the deployed position, the regenerative system resistor adds aerodynamic drag to the electrified vehicle. In examples, the at least one fan includes first, second and third first fans arranged to direct air in a direction laterally relative to ground. In other examples, the at least one fan can additionally or alternatively include first, second and third second fans arranged to direct air in a direction downward relative to ground.

According to another example aspect of the invention, a method for controlling a regenerative braking system of an electrified vehicle is provided. In one example implementation, the method includes determining whether a battery system that selectively stores and delivers power can accept full power input; determining whether an accessory load can dissipate full regenerative power; and deploying a regenerative system resistor from a first position during regenerative braking in a first mode to a second position wherein regenerative power is directed to the regenerative system resistor and dissipated as heat in a second mode based on a determination that the battery system cannot accept full power input and the accessory load cannot dissipate full regenerative power. A determination is made whether the regenerative system resistor can dissipate heat. At least one fan is operated based on a determination that the regenerative system resistor cannot dissipate heat.

In additional arrangements, the method can include receiving a signal from a temperature sensor associated with the regenerative system resistor. The signal is compared to a temperature threshold. The at least one fan is operated based on the comparing. In examples, a speed of the fan is variably operated based on the comparing.

In other arrangements, operating the at least one fan comprises operating at least one of first, second and third first fans arranged to direct air in a direction laterally relative to ground and at least one of first, second and third second fans arranged to direct air in a direction downward relative to ground.

In additional arrangements, the method can include determining whether regenerative braking is desired; and deploying the regenerative system resistor based on the determination that regenerative braking is desired. In examples, in the first position, the regenerative system resistor is retracted toward the electrified vehicle out of alignment with a direct air path during operation of the electrified vehicle. In the second position, the regenerative system resistor is deployed away from the electrified vehicle in alignment with a direct air path during operation of the electrified vehicle.

In additional features, the controller is configured to send a signal to an actuator based on the determination that the battery system cannot accept full power input and the accessory load cannot dissipate full regenerative power, the actuator moving the regenerative system resistor from the first position to the second position. In the deployed position, a fan associated with the regenerative system resistor is configured to rotate and further dissipate heat. In the deployed position, the regenerative system resistor adds aerodynamic drag to the electrified vehicle.

In additional examples, the method includes directing regenerative power to the accessory load regardless of a charge state of the battery system. The accessory load can accept at least a portion of the regenerative power.

Further areas of applicability of the teachings of the present application will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present application are intended to be within the scope of the present application.

DESCRIPTION

Conventional electrified vehicles typically rely on engine braking to manage vehicle speed and acceleration on road downgrades to inhibit vehicle runaway and excessive heat generation. Such systems also reduce wear on a conventional friction brake system. As is known, an electric motor or motors in an electrified vehicle can act as an electric generator when the electric motor or motors stop supplying power to the vehicle drivetrain for propulsion. In examples, the electric motor(s) can rotate backwards while converting kinetic energy from the vehicle wheels as they slow down into electricity that can be stored back in the vehicle battery. Further, in many instances a vehicle deceleration rate can be controlled solely by a regenerative braking system without using the conventional friction brake system. Examples include a vehicle motion controlled primarily by the accelerator pedal, or a zero accelerator pedal input coasting deceleration while traveling down a grade.

In an electrified vehicle, the ability of the electric drive motor(s) to provide regenerative braking requires a mechanism to use or store the power being generated by the electric motor(s) during regenerative braking. If the battery system is at or close to a maximum state of charge, regenerative power dissipation is not directed to the battery and is instead limited to power being used by accessory loads. In some instances, accessory load power is not sufficient to maintain vehicle speed and acceleration on a downgrade or event meaning conventional friction brakes will have to supplement regenerative braking which can cause brake wear and/or heat generation. As will be described herein, the present disclosure provides a regenerative braking system that incorporates a deployable and retractable resistor that converts motor regenerative power to heat which can be transferred to the ambient environment when regenerative braking is desired (to maintain an expected driver feedback experience regardless of battery charge state), but battery state of charge is too high for the battery system to accept this power.

Accordingly, the regenerative system resistor described herein can be used to turn regenerative motor power into heat that can be dissipated to atmosphere when a vehicle battery does not have sufficient capacity to accept the power such that regenerative braking (perceived by the driver) can be maintained even when battery state of charge is high. The resistor can be configured so that it's deployable when needed in a use position and retractable when not needed. In a deployed position, the regenerative system resistor can contribute some aerodynamic drag which can be preferable in a situation where regenerative braking is desired. In examples, the resistor can be a dump resistor.

Figure 1:
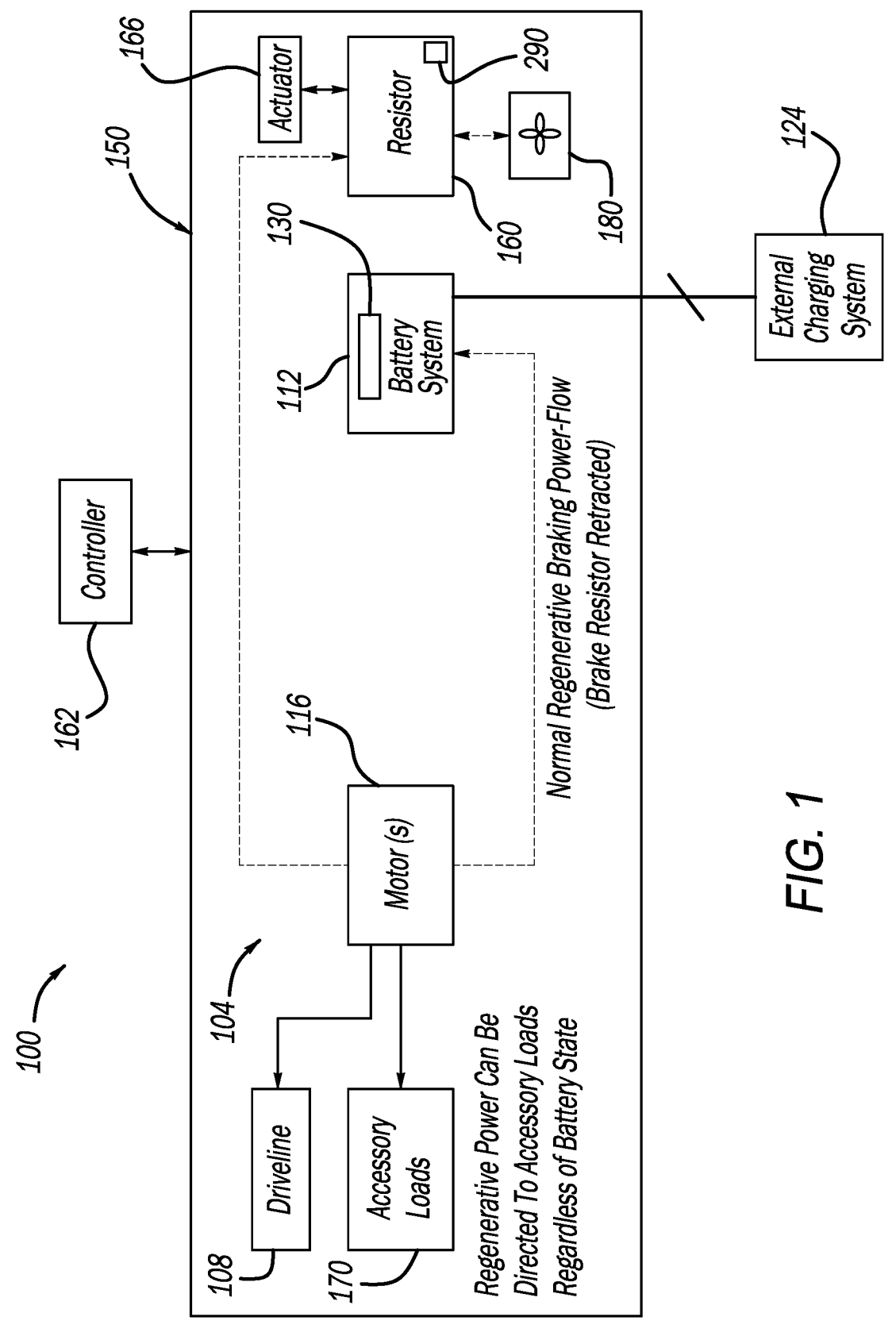
FIG. 1 is a functional block diagram of an electrified vehicle having a regenerative braking system that incorporates a deployable regenerative system resistor according to the principles of the present application.

Referring now to FIG. 1, a functional block diagram of an example electrified vehicle 100 (also referred to herein as "vehicle 100") according to the principles of the present application is illustrated. The vehicle 100 includes an electrified powertrain 104 configured to generate and transfer drive torque to a driveline 108 of the vehicle 100 for propulsion. The electrified powertrain 104 generally comprises a high voltage battery system 112 (also referred to herein as "battery system 112"), one or more electric motors 116, and a transmission. The battery system 112 is selectively connectable (e.g., by the driver) to an external charging system 124 (also referred to herein as "charger 124") for charging of the battery system 112. The battery system 112 includes at least one battery module 130.

The electrified vehicle 100 incorporates a regenerative braking system 150. The regenerative braking system 150 according to the present disclosure incorporates a deployable regenerative system resistor 160. A controller 162 can determine an operating state of the deployable regenerative system resistor 160 depending on sensed operating conditions of the vehicle 100 and a charging state of the battery system 112. An actuator 166 can receive signals from the controller 162 indicative of a desired operating state of the regenerative system resistor 160 and move the regenerative system resistor between retracted (FIG. 2) and deployed (FIG. 3) positions based on the signals. As used herein the regenerative braking system 150 is used to encompass non-braking deceleration events in which regeneration of the battery system 112 (high or low voltage system) can occur.

In examples, the regenerative braking system 150 can be configured to direct regenerative power from the motor(s) 116 to accessory loads 170. Accessory loads can be any vehicle loads that can draw electric power from the battery system 112. Accessory loads can be an alternative method of using power in addition to routing power back to the battery system 112. In additional examples, a fan 180 can be additionally associated with the deployable regenerative system resistor 160. The fan 180 can optionally provide additional heat rejection properties.

Figure 2:
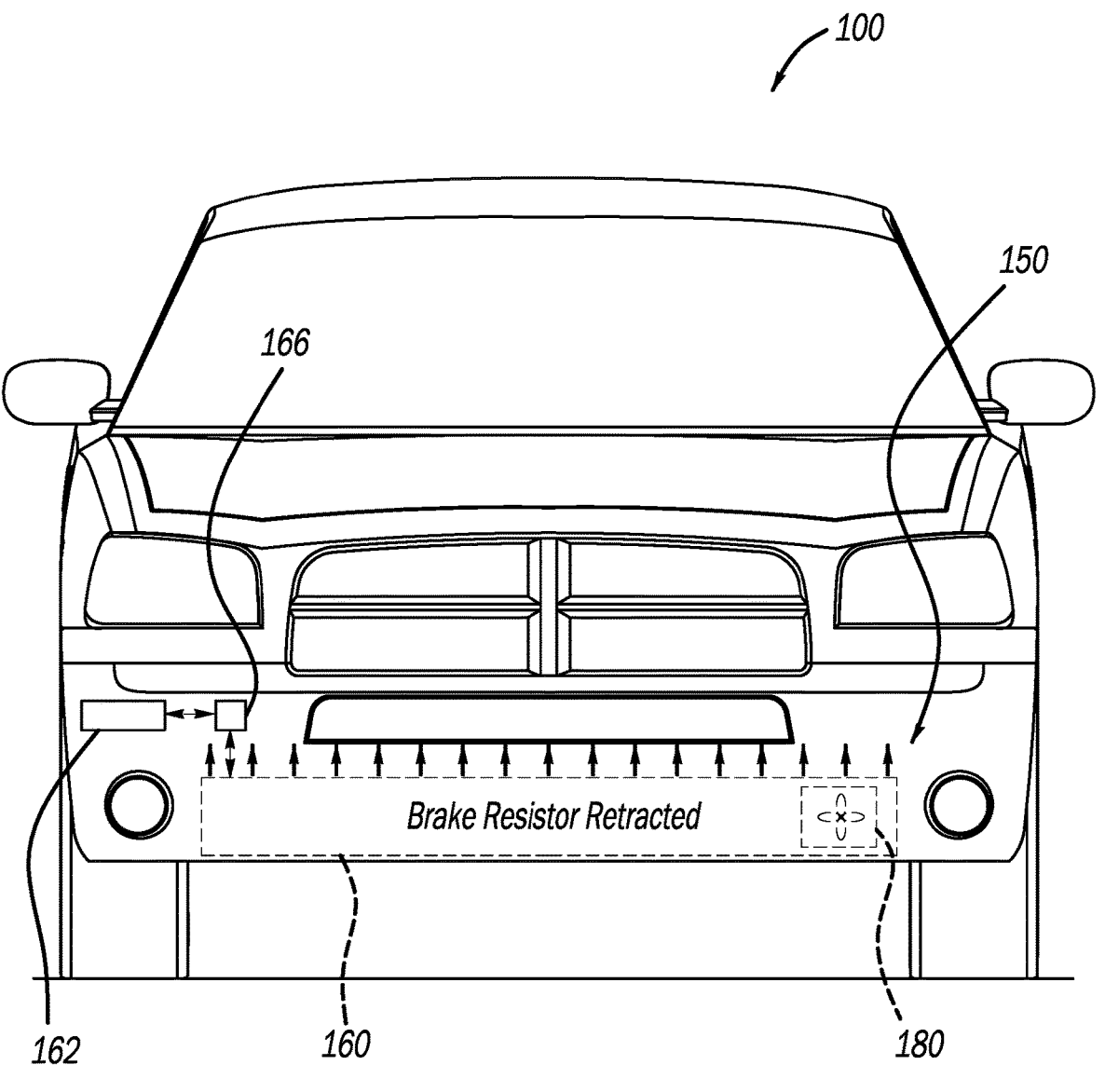
FIG. 2 is a front view of an exemplary electrified vehicle incorporating the regenerative braking system of FIG. 1 and shown with the deployable regenerative system resistor in a first or retracted position according to the principles of the present application.
Figure 3:
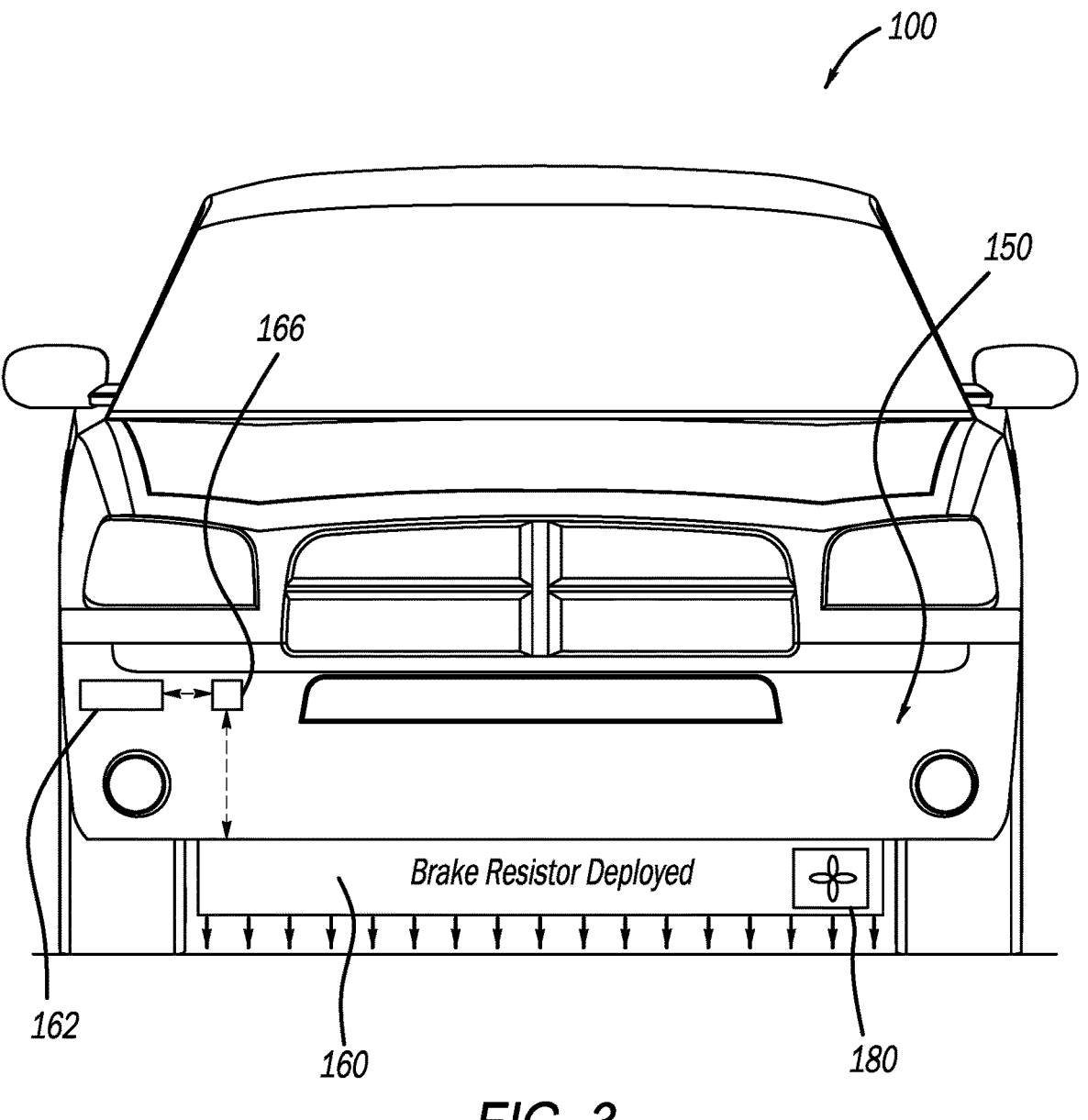
FIG. 3 is a front view of an exemplary electrified vehicle incorporating the regenerative braking system of FIG. 1 and shown with the deployable regenerative system resistor in a second or deployed position according to the principles of the present application.

With continued reference to FIG. 1 and additional reference to FIGS. 2 and 3, the regenerative braking system 150 according to the present disclosure will be further described. As identified above, providing a consistent level of regenerative braking feedback to the driver, regardless of battery state of charge, is especially desirable for customer satisfaction. In particular, it is preferable for the driver to experience the same feedback, such as from the motor(s) 116 and/or the driveline 108 during operation of the vehicle regardless of the charge state of the battery system 112. In other words, just because the battery system 112 may be fully charged, disabling the regenerative braking functionality (perceived by the driver) would invite a confusing and inconsistent driver experience. Explained differently, it is a goal to provide consistent feedback of the driveline 108 and the motor(s) 116 to the driver during vehicle use regardless of the charge state of the battery system 112.

FIG. 2 is an exemplary illustration of the regenerative braking system 150 of FIG. 1 and shown with the deployable regenerative system resistor 160 in a first or retracted position. The first or retracted position reflects the regenerative system resistor 150 not deployed such as when the regenerative braking system 150 is directing energy from the motors 116 to the battery system 112. See also "normal regenerative braking power-flow", FIG. 1. Of note, the regenerative system resistor 160 can be located generally in a position concealed from view or otherwise out of direct air path during forward movement of the electrified vehicle 100. In the retracted position, the regenerative system resistor 160 is positioned in a location to minimize aerodynamic drag.

With particular reference to FIG. 3, the regenerative system resistor 160 can be located generally in a second or deployed position. In the deployed position, the regenerative system resistor 160 can be generally moved to a location substantially in direct contact with ambient air while the vehicle is moving. When in the deployed position, the regenerative system resistor 160 adds aerodynamic drag which is advantageous when additional braking is desired. When in the deployed position, the regenerative system resistor 160 converts regenerative power of the motor(s) 116 into heat which can be dissipated to ambient environment. As identified above, the regenerative power of the motor(s) 116 would otherwise be directed back into the battery system 112. The regenerative braking system 150 can recognize when the battery system 112 does not need more regenerative power (e.g., the battery system 112 is sufficiently charged) and can divert the regenerative power to the regenerative system resistor 160 and/or the accessory loads 170. In some examples, the accessory loads 170 are sufficient to accommodate all of the diverted regenerative power. In other examples, the accessory loads 170 cannot handle all of the diverted regenerative power and the regenerative system resistor 160 can assist in handling the additional diverted regenerative power (without disabling the regenerative power functionality of the motor 116).

In the deployed position, the fan 180 can be moved for interaction with ambient air to provide additional heat rejection properties. Rotation of the fan blades by ambient air can be converted into desirable heat loss properties of the regenerative system resistor 160. It is appreciated that the fan 180 can be configured in any manner such as with one or more fans having one or more fan blades.

The actuator 166 can move the regenerative system resistor 160 between the retracted and deployed positions. The actuator 166 can be any device (electrical, mechanical, hydraulic or combinations thereof), suitable to move the regenerative system resistor 160 between the retracted and deployed positions. It is further contemplated that in some situations it may be desirable to move the regenerative system resistor 160 to some position intermediate a fully retracted and fully deployed position depending on operating conditions.

Figure 4:
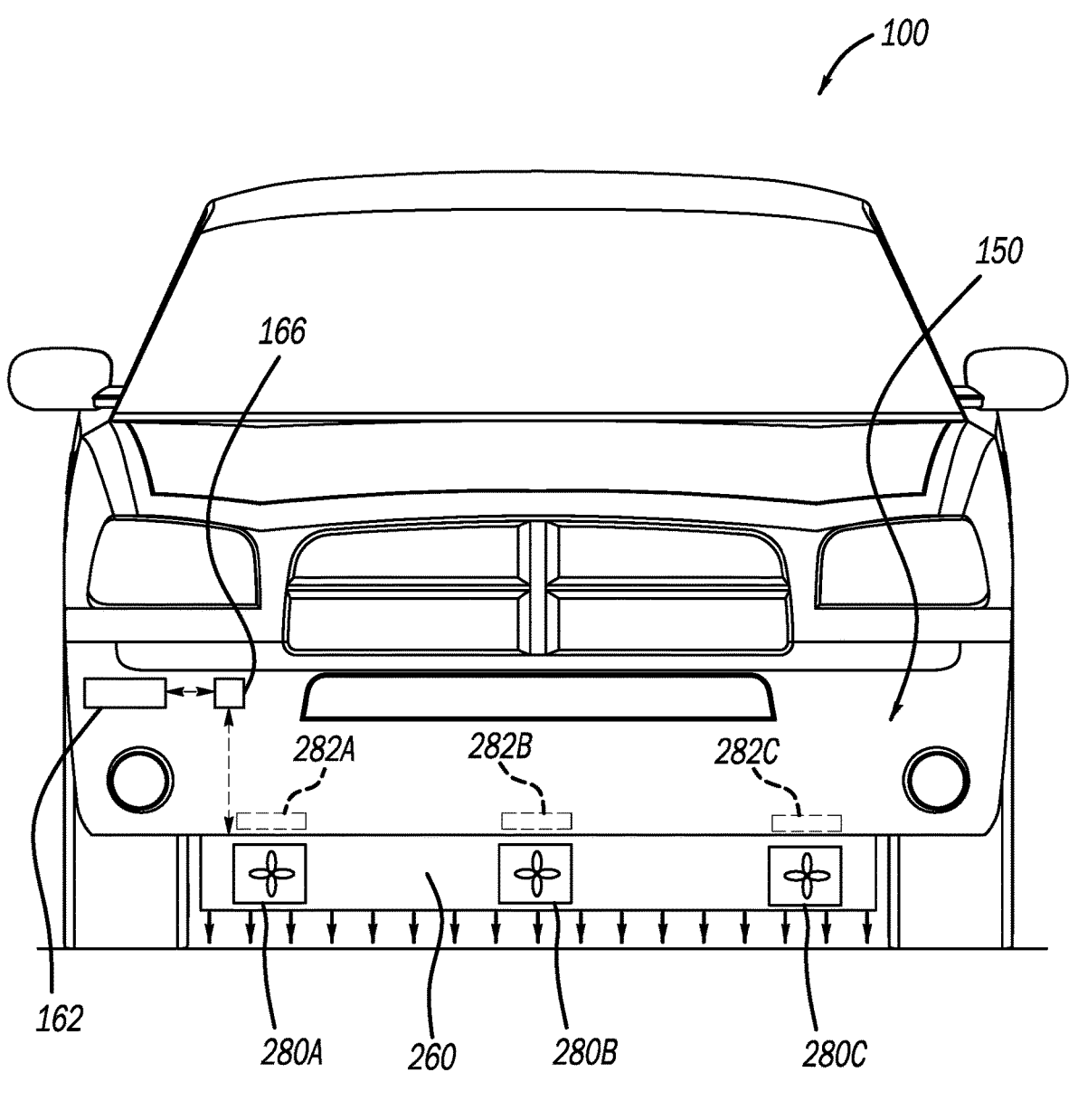
FIG. 4 is a front view of an exemplary electrified vehicle incorporating the regenerative braking system of FIG. 1 and shown with the deployable regenerative system resistor in a second or deployed position according to additional principles of the present application.

With reference now to FIG. 4 the regenerative system resistor 260, according to another example of the present disclosure, is shown in the second or deployed position. Unless otherwise described herein, the operation of the regenerative system resistor 260 is the same as described with respect to the regenerative system resistor 160. The regenerative system resistor 260 can include multiple fans. In the example shown, the regenerative system resistor 260 includes first fans 280A, 280B and 280C. The first fans 280A, 280B and 280C can be arranged to direct air in a direction laterally relative to the ground and located anywhere on the regenerative system resistor 260 such as spaced laterally as shown. Additionally or alternatively, the regenerative system resistor 260 can include second fans 282A, 282B and 282C. The second fans 282A, 282B and 282C can be arranged to direct air downward and located anywhere on the regenerative system resistor 260 such as spaced laterally as shown. It will be appreciated that any combination of the fans 280A, 280B, 280C, 282A, 282B and 282C can be configured on the regenerative system resistor 260. It will also be appreciated that some or all of the fans 280A, 280B, 280C, 282A, 282B and 282C can be fixed to the regenerative system resistor 260 for translation with the regenerative system resistor 260 between the retracted and deployed positions. In other examples some or all of the fans 280A, 280B, 280C, 282A, 282B and 282C can be fixed to the vehicle 100 and configured not to translate with the regenerative system resistor 260.

Some or all of the fans 280A, 280B, 280C, 282A, 282B and 282C can be turned on based on a determination whether the regenerative system resistor 260 can dissipate heat without external fan use. In some operating conditions, such as at low vehicle speeds, airflow directed onto the regenerative system resistor 260 is insufficient to cool the regenerative system resistor 260 in the deployed position. In examples, the controller 162 receives a signal from a sensor 290 (FIG. 1) to determine whether to activate any of the fan(s) 280A, 280B, 280C, 282A, 282B. In one example, the sensor 290 can be configured to measure a temperature and/or an airflow. If the regenerative system resistor 260 can dissipate heat without the external fan(s), the controller 162 does not turn the fan(s) 280A, 280B, 280C, 282A, 282B on. If the controller 162 determines that the resistor 260 cannot dissipate heat without the external fan(s) 280A, 280B, 280C, 282A, 282B and 282C (for example, the vehicle is not moving at sufficient speeds to provide suitable airflow onto the resistor 260 to dissipate heat, and/or the temperature sensed by the sensor 290 exceeds a threshold), the controller 162 sends a signal to the fan(s) 280A, 280B, 280C, 282A, 282B and 282C to turn them on. In examples, the controller 162 can turn the fan(s) 280A, 280B, 280C, 282A, 282B and 282C on at variable speeds based on airflow requirements to cool the regenerative system resistor 260.

In the deployed position, the regenerative system resistor 260 can be generally moved to a location substantially in direct contact with ambient air while the vehicle is moving. When in the deployed position, the regenerative system resistor 260 adds aerodynamic drag which is advantageous when additional braking is desired. When in the deployed position, the regenerative system resistor 260 converts regenerative power of the motor(s) 116 into heat which can be dissipated to ambient environment. As identified above, the regenerative power of the motor(s) 116 would otherwise be directed back into the battery system 112. The regenerative braking system 150 can recognize when the battery system 112 does not need more regenerative power (e.g., the battery system 112 is sufficiently charged) and can divert the regenerative power to the regenerative system resistor 260 and/or the accessory loads 170. In some examples, the accessory loads 170 are sufficient to accommodate all of the diverted regenerative power. In other examples, the accessory loads 170 cannot handle all of the diverted regenerative power and the regenerative system resistor 260 can assist in handling the additional diverted regenerative power (without disabling the regenerative power functionality of the motor 116).

In the deployed position, some or all of the fans 280A, 280B, 280C, 282A, 282B and 282C can be moved for interaction with ambient air and are operated to direct air against and therefore to cool the regenerative system resistor 260 and provide additional heat rejection properties. Rotation of the fan blades by ambient air can be converted into desirable heat loss properties of the regenerative system resistor 260. It is appreciated that the fans 280A, 280B, 280C, 282A, 282B and 282C can be configured in any manner such as with one or more fans having one or more fan blades.

The actuator 166 can move the regenerative system resistor 260 between the retracted and deployed positions. The actuator 166 can be any device (electrical, mechanical, hydraulic or combinations thereof), suitable to move the regenerative system resistor 260 between the retracted and deployed positions. It is further contemplated that in some situations it may be desirable to move the regenerative system resistor 260 to some position intermediate a fully retracted and fully deployed position depending on operating conditions.

Figure 5A:
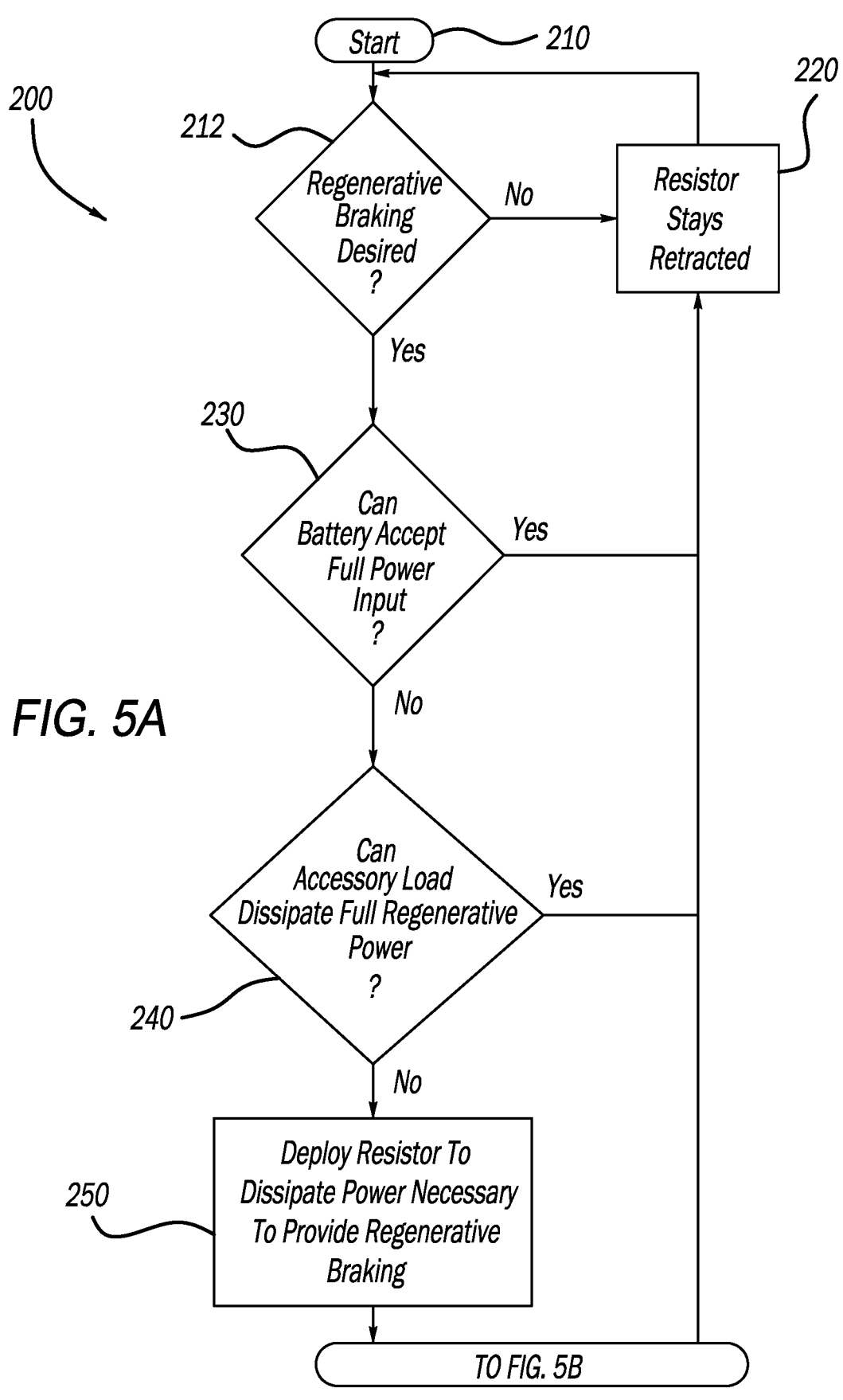
FIGS. 5A and 5B is an exemplary logic flow diagram of a controller that determines an operating state of the deployable regenerative system resistor of the present disclosure.
Figure 5B:
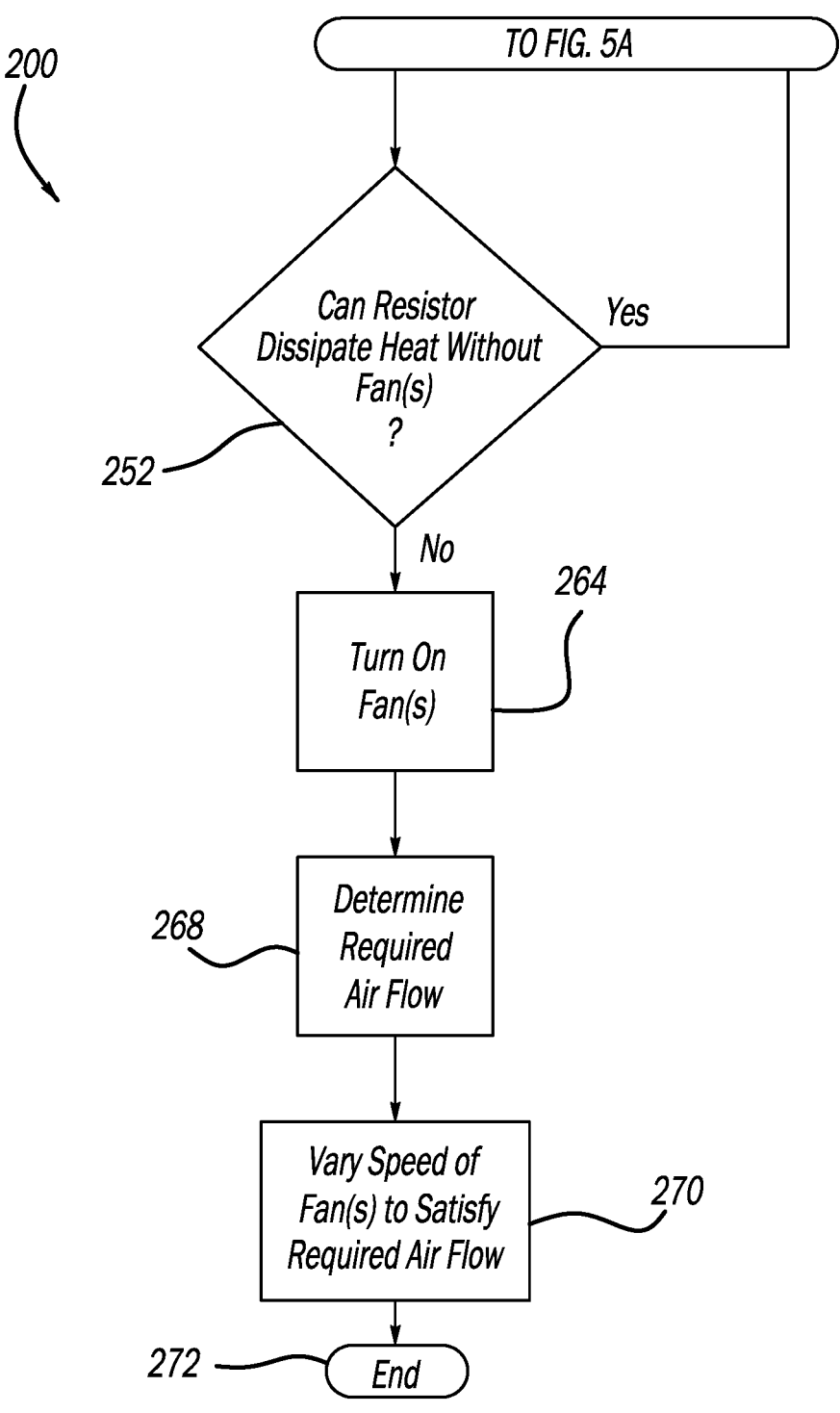

With particular reference now to FIGS. 5A and 5B, a flow chart 200 is shown illustrating an exemplary control methods for using the regenerative braking system 150 according to various examples of the present disclosure. Control starts at 210. At 212 control determines whether regenerative braking is desired. If regenerative braking is not desired, the regenerative system resistor 160, 260 stays in a retracted position. If regenerative braking is desired, control determines whether the battery system 112 can accept full power input. If the battery system 112 can accept full power input, control loops to 220 where the regenerative system resistor 160, 260 stays retracted. If the battery system 112 cannot accept full power input, control determines whether the accessory loads 170 can dissipate full regenerative brake power.

If the accessory loads 170 can dissipate full regenerative power, control loops to 220 where the regenerative system resistor 160, 260 stays retracted. If the accessory loads 170 cannot dissipate full regenerative power, the regenerative system resistor 160, 260 is deployed from the retracted position (FIG. 2) to the deployed position (FIGS. 3 and 4). As explained above, the regenerative system resistor 160, 260 can be moved between the retracted and deployed positions by way of the actuator 166. At 252, control determines whether the regenerative system resistor 160, 260 can dissipate heat without the fan(s) 180, 280A, 280B, 280C, 282A, 282B and 282C activated.

As identified above, the controller 162 can base this determination on determining whether the vehicle 100 is moving at sufficient speeds to provide suitable airflow onto the resistor 160, 260 to dissipate enough heat. Additionally or alternatively, the determination can be made based on feedback from the sensor 290 that sends signals indicative of operating conditions of the regenerative system resistor 160, 260 including a temperature. In another scenario, the controller 162 can determine that the vehicle 100 is travelling at low speed but traversing a steep grade (determined by vehicle sensors and/or software) where regenerative braking is high (or the driver has selected). The controller can operate the fan(s) 180, 280A, 280B, 280C, 282A, 282B and 282C to dissipate energy to atmosphere without the resistor 160, 260 deployed. In yet another example, the controller 162 can determine that the vehicle 100 is travelling at low speeds and on substantially level ground (such as in city traffic) or when a driver selects a setting which employs higher regenerative operation parameters. The controller 162 can operating the fan(s) 180, 280A, 280B, 280C, 282A, 282B and 282C without deploying the resistor 160, 260.

If control determines that the regenerative system resistor 160, 260 can dissipate heat without operating the fan(s) 180, 280A, 280B, 280C, 282A, 282B and 282C, control loops to 220. If control determines that the regenerative system resistor 160, 260 cannot dissipate heat without operating the fan(s) 180, 280A, 280B, 280C, 282A, 282B and 282C, control turns one or more of the fan(s) 180, 280A, 280B, 280C, 282A, 282B and 282C on. As a secondary benefit, the power consumed by operating the fan(s) 180, 280A, 280B, 280C, 282A, 282B and 282C will provide another energy consumption path to further dissipate energy.

At 268 control determines a required air flow needed to dissipate enough heat or achieve a suitable operating temperature of the regenerative system resistor 160, 260. At 270 control varies the speed of the fan(s) 180, 280A, 280B, 280C, 282A, 282B and 282C to satisfy a required air flow needed to achieve the suitable operating temperature of the regenerative system resistor 160, 260. Control ends at 272. It is appreciated that control can alternatively be configured to loop back to step 212.

It will be appreciated that the term "controller" or "module" as used herein refers to any suitable control device or set of multiple control devices that is/are configured to perform at least a portion of the techniques of the present disclosure. Non-limiting examples include an application-specific integrated circuit (ASIC), one or more processors and a non-transitory memory having instructions stored thereon that, when executed by the one or more processors, cause the controller to perform a set of operations corresponding to at least a portion of the techniques of the present disclosure. The one or more processors could be either a single processor or two or more processors operating in a parallel or distributed architecture.

It will be understood that the mixing and matching of features, elements, methodologies, systems and/or functions between various examples may be expressly contemplated herein so that one skilled in the art will appreciate from the present teachings that features, elements, systems and/or functions of one example may be incorporated into another example as appropriate, unless described otherwise above. It will also be understood that the description, including disclosed examples and drawings, is merely exemplary in nature intended for purposes of illustration only and is not intended to limit the scope of the present application, its application or uses. Thus, variations that do not depart from the gist of the present application are intended to be within the scope of the present application.

What is claimed is:

1. A regenerative braking system for an electrified vehicle, the regenerative braking system comprising:
   a battery system that selectively stores and delivers power;
   an electric motor that is powered by the battery system and transfers drive torque to a driveline for propulsion of the vehicle and that selectively directs regenerative power in a first mode to the battery system during regenerative braking;
   a regenerative system resistor that is selectively movable between a first position during the regenerative braking in the first mode wherein the regenerative system resistor is retracted toward the electrified vehicle out of substantial alignment with a direct air path during operation of the electrified vehicle, and a second position where regenerative power is directed to the regenerative system resistor and dissipated as heat in a second mode;
   at least one fan disposed on the regenerative system resistor and that selectively operates to direct air onto the regenerative system resistor to cool the regenerative system resistor based on operating conditions; and
   a controller that receives a signal from a sensor associated with the regenerative system resistor and that operates the at least one fan based on the signal.

2. The regenerative braking system of claim 1, wherein in the second position, the regenerative system resistor is moved to a deployed position from the electrified vehicle in substantial alignment with a direct air path during operation of the electrified vehicle.

3. The regenerative braking system of claim 2, further comprising:
   an actuator that selectively moves the regenerative system resistor between the retracted and deployed positions.

4. The regenerative braking system of claim 1, wherein the sensor is one of a temperature sensor that senses a temperature of the regenerative system resistor and an air flow sensor that senses an airflow at the regenerative system resistor, and wherein the controller operates the at least on fan at variable speed based on the signal received from the sensor.

5. The regenerative braking system of claim 2 wherein the controller determines whether regenerative braking is required and sends a signal to the actuator to deploy the regenerative system resistor based on the determination.

6. The regenerative braking system of claim 5, wherein the controller is further configured to determine whether the battery system can accept full power input from the electric motor and deploy the regenerative system resistor based on the determination.

7. The regenerative braking system of claim 6, wherein the controller is further configured to determine whether accessory loads can dissipate full regenerative power and deploy the regenerative system resistor based on the determination.

8. The regenerative braking system of claim 2, wherein in the deployed position the regenerative system resistor adds aerodynamic drag to the electrified vehicle.

9. The regenerative braking system of claim 1 wherein the at least one fan comprises first, second and third first fans arranged to direct air in a direction laterally relative to ground.

10. The regenerative braking system of claim 1 wherein the at least one fan comprises first, second and third second fans arranged to direct air in a direction downward relative to ground.

11. A method for controlling a regenerative braking system of an electrified vehicle, the method comprising:
   determining whether a battery system that selectively stores and delivers power can accept full power input;
   determining whether an accessory load can dissipate full regenerative power;
   deploying a regenerative system resistor from a first position during regenerative braking in a first mode to a second position wherein regenerative power is directed to the regenerative system resistor and dissipated as heat in a second mode based on a determination that the battery system cannot accept full power input and the accessory load cannot dissipate full regenerative power;
   determining whether regenerative braking is desired;
   deploying the regenerative system resistor based on the determination that regenerative braking is desired;
   determining whether the regenerative system resistor can dissipate enough heat; and
   operating at least one fan based on a determination that the regenerative system resistor cannot dissipate enough heat.

12. The method of claim 11 wherein the determining whether the regenerative system resistor can dissipate enough heat comprises:
   receiving a signal from a temperature sensor associated with the regenerative system resistor;
   comparing the signal to a temperature threshold; and
   operating the at least one fan based on the comparing.

13. The method of claim 12 wherein operating the at least one fan comprises variably operating a speed of the at least one fan based on the comparing.

14. The method of claim 13 wherein operating the at least one fan comprises operating at least one of first, second and third first fans arranged to direct air in a direction laterally relative to ground and at least one of first, second and third second fans arranged to direct air in a direction downward relative to ground.

15. The method of claim 11, wherein in the first position, the regenerative system resistor is retracted toward the electrified vehicle out of alignment with a direct air path during operation of the electrified vehicle and wherein in the second position, the regenerative system resistor is deployed away from the electrified vehicle in alignment with a direct air path during operation of the electrified vehicle.

16. The method of claim 11, wherein a controller is configured to send a signal to an actuator based on the determination that the battery system cannot accept full power input and the accessory load cannot dissipate full regenerative power, the actuator moving the regenerative system resistor from the first position to the second position.

17. The method of claim 13, wherein in the deployed position, the regenerative system resistor adds aerodynamic drag to the electrified vehicle.

18. The method of claim 11, further comprising directing regenerative power to the accessory load regardless of a charge state of the battery system, the accessory load accepting at least a portion of the regenerative power.

19. A method for controlling a regenerative braking system of an electrified vehicle, the method comprising:

determining whether a battery system that selectively stores and delivers power can accept full power input;

determining whether an accessory load can dissipate full regenerative power;

deploying a regenerative system resistor from a first position during regenerative braking in a first mode to a second position wherein regenerative power is directed to the regenerative system resistor and dissipated as heat in a second mode based on a determination that the battery system cannot accept full power input and the accessory load cannot dissipate full regenerative power;

determining whether the regenerative system resistor can dissipate enough heat;

operating at least one fan based on a determination that the regenerative system resistor cannot dissipate enough heat; and wherein a controller is configured to send a signal to an actuator based on the determination that the battery system cannot accept full power input and the accessory load cannot dissipate full regenerative power, the actuator moving the regenerative system resistor from the first position to the second position.

* * * * *